United States Patent [19]

Takagi

[11] Patent Number: 5,684,816
[45] Date of Patent: Nov. 4, 1997

[54] LIGHT INTERACTIVE SEMICONDUCTOR DEVICE INCLUDING WIRE CONNECTION AT INTERNAL LIGHT DISTRIBUTION MAXIMUM

[75] Inventor: Kazuhisa Takagi, Tokyo, Japan

[73] Assignee: Mitsubishi Denki Kabushiki Kaisha, Tokyo, Japan

[21] Appl. No.: 588,089

[22] Filed: Jan. 18, 1996

[30] Foreign Application Priority Data

Apr. 7, 1995 [JP] Japan .................... 7-082378

[51] Int. Cl.$^6$ .................... H01S 3/19; H01S 3/097; H01S 3/00
[52] U.S. Cl. .................... 372/44; 372/46; 372/49; 372/87; 359/344
[58] Field of Search .................... 372/43, 44, 96, 372/49, 46, 87; 257/81, 786, 99; 359/344

[56] References Cited

U.S. PATENT DOCUMENTS

| 3,660,780 | 5/1972 | Iida et al. ........................ | 372/49 |
|-----------|--------|----------------------------------|--------|
| 3,790,902 | 2/1974 | Miller ........................... | 372/49 |
| 4,796,273 | 1/1989 | Yamaguchi ....................... | 372/49 |
| 4,905,245 | 2/1990 | Ponjee et al. .................... | 372/49 |
| 4,951,291 | 8/1990 | Miyauchi et al. ................. | 372/49 |
| 5,012,478 | 4/1991 | Hattori et al. ................... | 372/49 |
| 5,088,105 | 2/1992 | Scifres et al. ................... | 372/49 |
| 5,412,496 | 5/1995 | Nakajima et al. ................. | 372/96 |

FOREIGN PATENT DOCUMENTS 62-37909  8/1987  Japan .
1266781  10/1989  Japan .

*Primary Examiner*—Rodney B. Bovernick
*Assistant Examiner*—Luong-Quyen T. Phan
*Attorney, Agent, or Firm*—Leydig, Voit & Mayer, Ltd.

[57] ABSTRACT

An optical semiconductor device includes an active layer through which light travels, having opposed first and second surfaces; a semiconductor layer of a first conductivity type disposed on the first surface of the active layer; a first electrode contacting the first conductivity type semiconductor layer; a semiconductor layer of a second conductivity type, opposite the first conductivity type, disposed on the second surface of the active layer; a second electrode contacting the second conductivity type semiconductor layer; a wire bonded to one of the first and second electrodes at a position in the resonator length direction corresponding to a localized maximum of a light density distribution in the active layer along the resonator length direction. Current is injected into the device opposite the localized maximum point of the light density distribution in the active layer so that the current density distribution in the active layer along the resonator length direction is proportional to the light density distribution and has a localized maximum at a position approximately at the localized maximum of the light density distribution. Therefore, the carrier density distribution caused by the light density distribution along the resonator length direction is canceled by the current density distribution, whereby the carrier density in the active layer along the resonator length direction is made uniform.

10 Claims, 7 Drawing Sheets

$$R_1 = \frac{\Delta x}{\sigma_1 W d_1}$$

$$R_2 = \frac{d_2}{\sigma_2 \Delta x W}$$

Fig.3 distance from the front facet

Fig.6 distance from the front facet

Fig.7

Fig.8 distance from the front facet

Prior Art

LIGHT INTERACTIVE SEMICONDUCTOR DEVICE INCLUDING WIRE CONNECTION AT INTERNAL LIGHT DISTRIBUTION MAXIMUM

FIELD OF THE INVENTION

The present invention relates to optical semiconductor devices used in optical communication systems and optical information processing systems and, more particularly, to a technique for making the carrier density in the active layer along the resonator length direction uniform during operation.

BACKGROUND OF THE INVENTION

Generally, the rate of change of carriers in an active layer of an optical device, such as a semiconductor laser or a semiconductor light amplifier, is represented by $$-\frac{dN}{dt} = \frac{I\eta_i}{qVa} - \xi G'S(N-NG) - \frac{1}{\tau_s} N \quad (1)$$

wherein N is the carrier density, $\xi$ is the confinement coefficient, NG is the transparent carrier density, Va is the active layer volume, t is the time, G' is the gain constant, $\tau_s$ is the carrier lifetime, $\eta_i$ is the internal quantum efficiency, q is the electronic charge, S is the light density, and I is the current.

In other words, the rate of change of carriers in the active layer is low in a region where the light density is low while it is high in a region where the light density is high. Therefore, when the current supplied to (injected into) the device is uniform in the resonator length direction, the carriers are insufficient in the region of the active layer where the light density is high, and the carriers are excessive in the region where the light density is low. The insufficiency of carriers in the active layer causes saturation of light output in a semiconductor laser and causes saturation of amplification factor in a semiconductor light amplifier.

As a countermeasure to the saturation of the light output and the saturation of the amplification factor due to the insufficiency of carriers in the active layer, Japanese Patent Publication No. Sho. 62-37909 (Japanese Published Patent Application No. Sho. 58-50790) proposes a method in which an anode electrode of an optical semiconductor device is divided into a plurality of portions, and the ratio of current injected into the respective portions, i.e., electrodes, is controlled in accordance with a distribution of light density in an active layer, more specifically, a large current is injected into the electrode disposed on a portion of the active layer having a large light density while a small current is injected into the electrode disposed on a portion of the active layer having a small light density.

Figure 11:
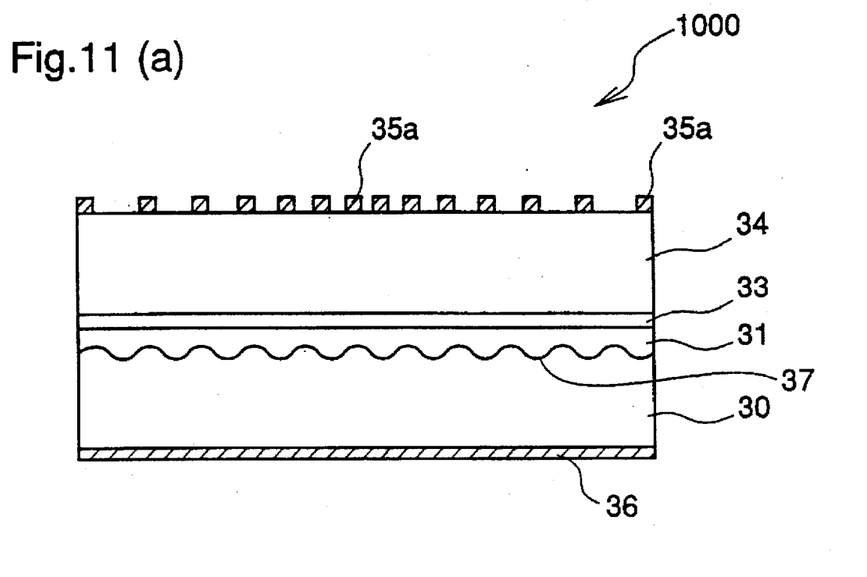
FIGS. 11(a) and 11(b) are cross-sectional views illustrating prior art DFB lasers proposed in Japanese Published Patent Application No. Hei.1-266781.

Meanwhile, FIGS. 11(a) and 11(b) are sectional views illustrating distributed feedback (hereinafter referred to as DFB) semiconductor lasers proposed in Japanese Published Patent Application No. Hei.1-266781. In FIG. 11(a), reference numeral 1000 designates a DFB laser. The DFB laser 1000 includes an n type InP substrate 30 having opposite front and rear surfaces. An n type InGaAsP waveguide layer 31 is disposed on the front surface of the n type InP substrate 30 and produces a diffraction grating 37 at the boundary between that layer and the n type InP substrate 30. An n type InGaAsP active layer 33 is disposed on the n type InGaAsP waveguide layer 31. A p type InGaAsP cladding layer 34 is disposed on the n type InGaAsP active layer 33. A plurality of minute electrodes 35a are disposed on the upper surface of the p type InGaAsP cladding layer 34. An Au/Ge/Ni electrode 36 is disposed on the rear surface of the n type InP substrate 30.

In FIG. 11(b), reference numeral 2000 designates a DFB laser. This DFB laser 2000 includes an n type InP substrate 30 having opposite front and rear surfaces. An n type InGaAsP waveguide layer 31 is disposed on the front surface of the n type InP substrate 30 and produces a diffraction grating 37 at the boundary between that layer and the n type InP substrate 30. An n type InGaAsP active layer 33 is disposed on the n type InGaAsP waveguide layer 31. A p type InGaAsP cladding layer 34 is disposed on the n type InGaAsP active layer 33. An n type InGaAsP reverse contact layer 38 is disposed on the p type InGaAsP cladding layer 34. P type minute diffused regions (p type minute contact layers) 39 are disposed within the n type InGaAsP reverse contact layer 38. An electrode 35 is disposed on the n type InGaAsP reverse contact layer 38, contacting the p type diffused regions 39. An Au/Ge/Ni electrode 36 is disposed on the rear surface of the n type InP substrate 30.

In these prior art DFB lasers 1000 and 2000 in which the resonator length is increased to narrow the spectral line width, the deflection of light to the central portion of the active layer in the resonator length direction that is caused by the increase in the resonator length is prevented to make the carrier density in the active layer along the resonator length direction uniform. For this purpose, in the DFB laser 1000, a plurality of minute electrodes 35a are arranged so that the interval between adjacent electrodes is smallest at the center portion in the resonator length direction and becomes larger nearer the resonator facets, and currents of the same magnitude are applied to the respective electrodes 35a to make the density of current injected into the active layer 33 larger in the center portion than in the region in the vicinity of the resonator facets. In the DFB laser 2000, an n type reverse contact layer 38 is disposed between the electrode 35 and the p type cladding layer 34, and a plurality of p type minute contact layers 39 are arranged in the n type reverse contact layer 38 so that the interval between the adjacent contact layers is smallest at the center portion of the device in the resonator length direction and becomes larger closer to the resonator facets. In this laser 2000, when current is applied to the electrode 35, the density of current injected into the active layer 33 becomes larger in the center portion than in the region in the vicinity of the resonator facets.

In the optical semiconductor device and the DFB lasers disclosed in the Japanese Notice of Patent No. Sho.62-37909 and the Japanese Published Patent Application No. Hei.1-266781, since the non-uniform light density in the active layer along the resonator length direction is canceled by the current injection, a uniform carrier density is obtained. However, in the prior art optical semiconductor device disclosed in the Japanese Notice of Patent No. Sho. 62-37909, since it is required to set the injected current for each electrode of the separate electrodes, current control means for setting the current for each electrode is needed besides the device, resulting in an increase in the device cost. In the DFB lasers disclosed in the Japanese Published Patent Application No. Hei. 1-266781, although the above-described problem, i.e., an increase in the device cost due to such current control means, is avoided, since the fabrication method includes the complicated process of producing a plurality of minute electrodes or a plurality of minute contact layers with a changing interval between adjacent electrodes or adjacent contact layers according to their positions in the device, the fabricating time and the process number are unfavorably increased, resulting in an increase in the fabricating cost.

SUMMARY OF THE INVENTION

It is an object of the present invention to provide an optical semiconductor device that can make the carrier density in the active layer along the resonator length direction uniform by current injection without providing a current controlling means besides the device and without special processing of the device structure itself.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an optical semiconductor device comprises an active layer through which light travels, having opposed first and second surfaces; a semiconductor layer of a first conductivity type, disposed on the first surface of the active layer; a first electrode contacting the first conductivity type semiconductor layer at a surface of the semiconductor layer opposite the surface contacting the active layer; a semiconductor layer of a second conductivity type, opposite the first conductivity type, disposed on the second surface of the active layer; a second electrode contacting the second conductivity type semiconductor layer at a surface of the semiconductor layer opposite the surface contacting the active layer; a wire being bonded to one of the first electrode and the second electrode and conducting a current to the electrode, the wire being bonded to a position on the electrode in the resonator length direction, the position corresponding to a localized maximum point of a distribution of light density in the active layer along the resonator length direction. In this structure, current is injected into the device from a region of the first electrode or the second electrode that is positioned above or below the localized maximum point of the distribution of the light density in the active layer along the resonator length direction, so that the distribution of the current density in the active layer along the resonator length direction becomes a distribution that is proportional to the distribution of the light density and has a localized maximum point at a position approximately equal to the localized maximum point of the distribution of the light density. Therefore, the distribution of the carrier density caused by the distribution of the light density in the active layer along the resonator length direction is canceled by the distribution of the current density, whereby the carrier density in the active layer along the resonator length direction is made uniform.

According to a second aspect of the present invention, the above-described optical semiconductor device is a Fabry-Perot semiconductor laser having a front facet and a rear facet which are formed across the active layer, the first conductivity type semiconductor layer, and the second conductivity type semiconductor layer and serve as reflecting mirror facets. Therefore, in the Fabry-Perot semiconductor laser, the distribution of the carrier density caused by the distribution of the light density in the active layer along the resonator length direction is canceled by the same function as described above, whereby the carrier density in the active layer along the resonator length direction is made uniform.

According to a third aspect of the present invention, in the above-described Fabry-Perot semiconductor laser, the front facet and the rear facet have the same reflectivity, and two wires are bonded to portions of one of the first electrode and the second electrode in the vicinity of the front facet and the rear facet, respectively. In this structure, current is injected into the device from regions of the first electrode or the second electrode that are positioned in the vicinity of the front facet and the rear facet, respectively, and the distribution of current density in the active layer along the resonator length direction becomes a distribution in which the current density at the front and rear facets gradually decreases toward the center of the resonator. Therefore, this distribution of the current density is proportional to the distribution of the light density in the active layer in which the light density at the front and rear facets gradually decreases toward the center of the resonator, and the distribution of the carrier density in the resonator length direction that is caused by the distribution of the light density in the active layer is canceled, whereby the carrier density in the active layer along the resonator length direction is made uniform.

According to a fourth aspect of the present invention, in the Fabry-Perot semiconductor laser, the front facet has a low reflectivity and the rear facet has a high reflectivity, and a wire is bonded to a portion of one of the first electrode and the second electrode in the vicinity of the front facet. In this structure, current is injected into the device from a region of the first electrode or the second electrode that is positioned in the vicinity of the front facet, and the distribution of current density in the active layer along the resonator length direction becomes a distribution in which the current density is maximum in the vicinity of the front facet and gradually decreases toward the rear facet. Therefore, this distribution of the current density is proportional to the distribution of the light density in the active layer in which the light density is maximum at the front facet and gradually decreases toward the rear facet, and the distribution of the carrier density in the resonator length direction that is caused by the distribution of the light density in the active layer is canceled, whereby the carrier density in the active layer along the resonator length direction is made uniform.

According to a fifth aspect of the present invention, the above-described optical semiconductor device is a distributed feedback semiconductor laser including a front facet and a rear facet which are formed across the active layer, the first conductivity type semiconductor layer, and the second conductivity type semiconductor layer and serve as reflecting mirror facets; a $\lambda/4$ diffraction grating having a $\lambda/4$ phase shifted region that is formed on the surface of the active layer or within one of the first conductivity type semiconductor layer and the second conductivity type semiconductor layer; and two wires being bonded to portions of one of the first electrode and the second electrode in the vicinity of the front facet and the rear facet, respectively, and a wire being bonded to a portion of the electrode opposite the $\lambda/4$ phase-shifted region of the diffraction grating. In this structure, current is injected into the device from regions of the first electrode or the second electrode that are positioned in the vicinity of the front facet and the rear facet, respectively, and from a region of the electrode that is positioned above or below the $\lambda/4$ phase-shifted point of the diffraction grating, so that the distribution of current density in the active layer along the resonator length direction becomes a distribution in which the current density is maximum at the front and rear facets and has a localized maximum point at the $\lambda/4$ phase-shifted point. Therefore, this distribution of the current density is proportional to the distribution of the light density in which the light density is maximum at the front and rear facets and has a localized maximum point at the $\lambda/4$ phase-shifted point, and the distribution of the carrier density in the resonator length direction that is caused by the distribution of the light density in the active layer is canceled, whereby the carrier density in the active layer along the resonator length direction is made uniform.

According to a sixth aspect of the present invention, the above-described optical semiconductor device is a semiconductor light amplifier including a front facet and a rear facet which are formed across the active layer, the first conductivity type semiconductor layer, and the second conductivity type semiconductor layer and serve as reflecting mirror facets; and two wires being bonded to portions of one of the first electrode and the second electrode in the vicinity of the front facet and the rear facet, respectively. In this structure, current is injected into the device from regions of the first electrode or the second electrode that are positioned in the vicinity of the front facet and the rear facet, respectively, and the distribution of current density in the active layer along the resonator length direction becomes a distribution in which the current density at the front and rear facets gradually decreases toward the center of the resonator. Therefore, this distribution of the current density is proportional to the distribution of the light density in the active layer in which the light density at the front and rear facets gradually decreases toward the center of the resonator, and the distribution of the carrier density in the resonator length direction that is caused by the distribution of the light density in the active layer is canceled, whereby the carrier density in the active layer along the resonator length direction is made uniform.

DETAILED DESCRIPTION OF THE PREFERRED EMBODIMENTS

Embodiment 1

FIGS. 1(a) and 1(b) are a perspective view and a side view in the resonator length direction, respectively, showing a Fabry-Perot semiconductor laser device according to a first embodiment of the present invention. In the figures, reference numeral 100 designates a Fabry-Perot semiconductor laser having a resonator length of 600 µm. The laser 100 includes an n type InP substrate 6, 100 µm thick having opposite front and rear surfaces. An n type InGaAsP cladding layer 9, 1.3 µm thick, an InGaAsP active layer 8 0.2 µm thick, and a p type InGaAsP cladding layer 7, 1.3 µm thick are disposed in this order on the front surface of the n type InP substrate 6, and these layers are formed in a mesa stripe 12. An n type InP current blocking layer 4, 1~2 µm thick and a p type InP current blocking layer 5, 1~2 µm thick are disposed on the substrate 6, contacting both sides of the mesa stripe 12. A p type InP contact layer 3 3 µm thick is disposed on the p type InGaAsP cladding layer 7 and on the n type InP current blocking layer 4. An evaporated Cr/Au film 2, 0.5 µm thick is disposed on the p type InP contact layer 3, and a plated Au electrode 1, 4 µm thick is disposed on the Cr/Au film 2. An evaporated Au-Ge/Ni/Ti/Pt/Au film (not shown) is disposed on the rear surface of the substrate 6, and a plated Au electrode 11 is disposed on the Au-Ge/Ni/Ti/Pt/Au film. A front facet 13 produced by cleaving the semiconductor layers 3~9 is covered with a reflecting film 15 having a low reflectivity (hereinafter referred to as a low reflectivity film), and a rear facet 14 is covered with a reflecting film 16 having a high reflectivity (hereinafter referred to as a high reflectivity film). Au wires 10 are bonded to portions of the plated Au electrode 1 in the proximity of the front facet 13. The low reflectivity film 15 covering the front facet 13 comprises, for example, an alumina film having a thickness equivalent to one fourth of the oscillation wavelength (λ) and a reflectivity of 1%. The high reflectivity film 16 covering the rear facet 14 comprises, for example, alternatingly laminated silicon (Si) films, each having a thickness of one fourth of the oscillation wavelength, and silicon dioxide ($SiO_2$) films, each having a thickness of one fourth of the oscillation wavelength, and a reflectivity higher than 95%. The p side electrode comprising the evaporated Cr/Au film 2 located on the p type InP contact layer 3 and the plated Au electrode 1 to which the Au wire 10 is bonded has a conductivity of $4.5 \times 10^5$ $\Omega cm^{-1}$. The p type InP contact layer 3 has a carrier concentration of $1 \times 10^{18}$ $cm^{-3}$ and a conductivity of 58 $\Omega cm^{-1}$. In FIG. 1(a), for facilitating the description of the laminated structure of the semiconductor layers, the reflecting films 15 and 16 are not shown. When the Fabry-Perot semiconductor laser is fabricated in a junction-down arrangement with the crystal growth surface being bonded to a heat sink, an Au wire for current injection is bonded to the n side electrode comprising the evaporated Au-Ge/Ni/Ti/Pt/Au film located on the rear surface of the n type InP substrate 6 and the plated Au electrode 11.

Figure 3:
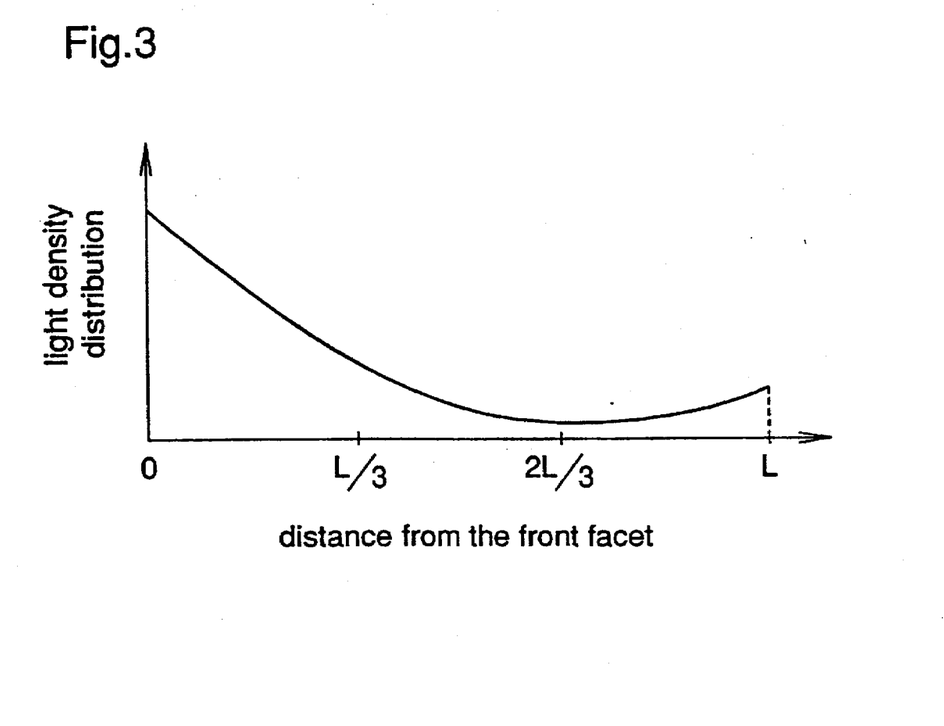
FIG. 3 is a diagram illustrating a distribution of light density in the active layer along the resonator length direction of the Fabry-Perot semiconductor laser having a resonator front facet covered with a reflecting film having a low reflectivity and a resonator rear facet covered with a reflecting film having a high reflectivity.

FIG. 3 is a diagram illustrating a light density distribution in the active layer and along the resonator length direction of the Fabry-Perot semiconductor laser having the front facet 13 and the rear facet 14 covered with the low reflectivity film 15 and the high reflectivity film 16, respectively. In the figure, reference character L denotes the resonator length, i.e., the distance from the front facet to the rear facet. As shown in FIG. 3, the Fabry-Perot semiconductor laser with such reflecting films on the front and rear facets has a light density distribution in which the light density is maximum at the front facet and gradually decreases with distance from the front facet and, after the distance of 2L/3 from the front facet is exceeded, it increases slightly toward the rear facet.

Figure 1:
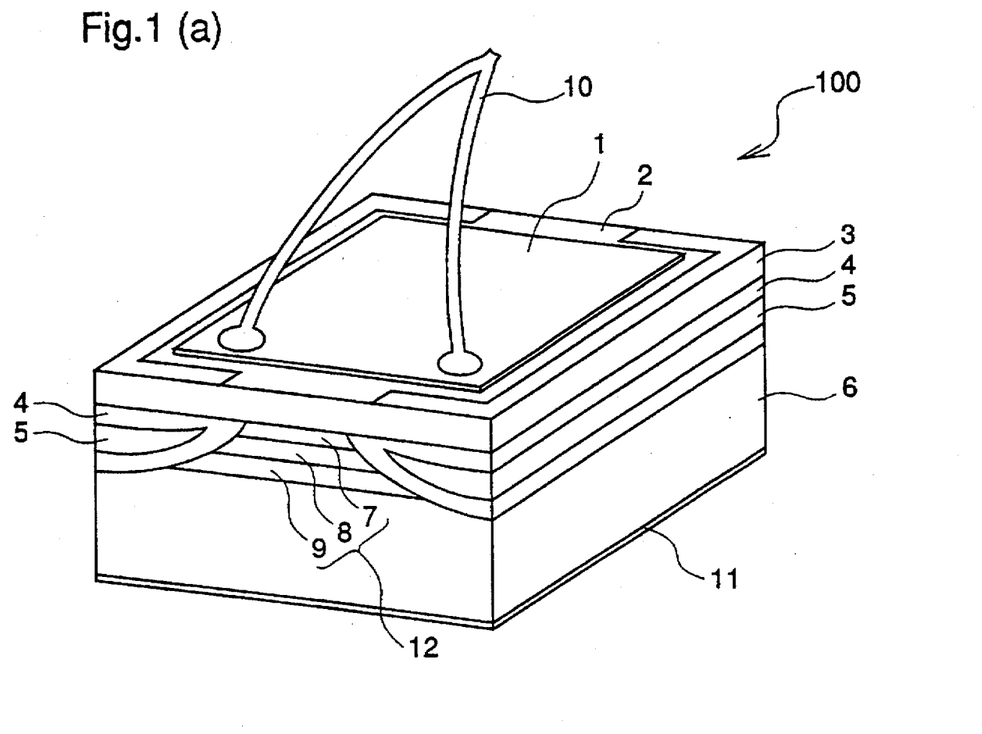
FIGS. 1(a) and 1(b) are a perspective view and a side view in the resonator length direction, respectively, illustrating a Fabry-Perot semiconductor laser device according to a first embodiment of the present invention.

When the Fabry-Perot semiconductor device shown in FIG. 1 is operated, the distribution of the current density in the active layer 8 along the resonator length direction is proportional to the distribution of the light density in the active layer 8 along the resonator length direction, and the carrier density in the active layer 8 along the resonator length direction is uniform. This function will be described in more detail hereinafter.

Figure 2:
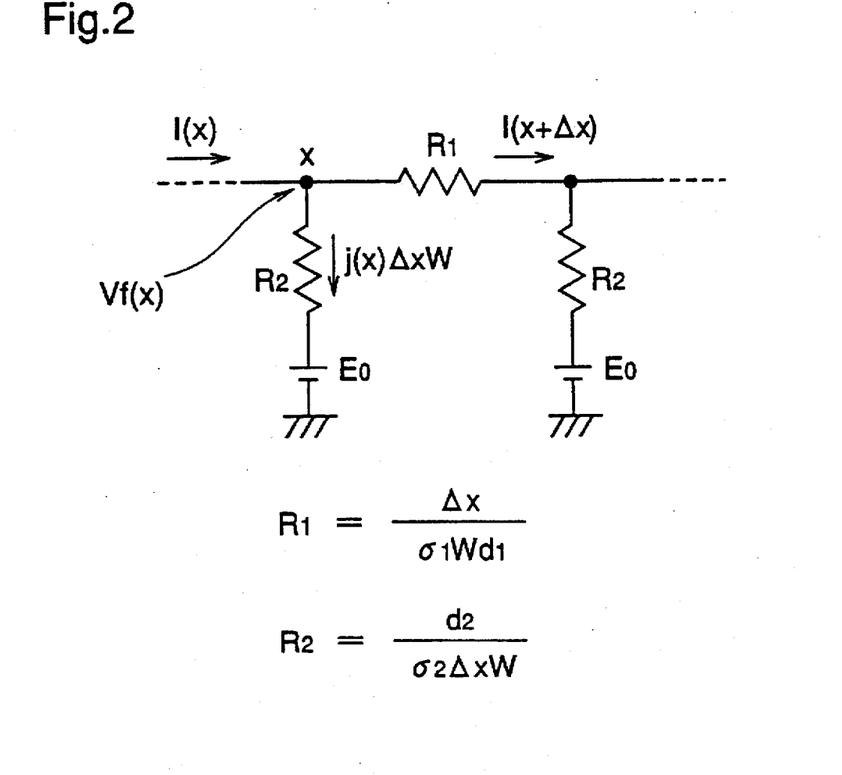
FIG. 2 is an equivalent circuit diagram showing the operating state of a Fabry-Perot semiconductor laser device.

FIG. 2 is an equivalent circuit diagram illustrating a typical Fabry-Perot semiconductor laser in the operating state. In the figure, reference character $\sigma_1$ denotes the conductivity of the electrode for current injection (hereinafter referred to as surface electrode). Reference character $\sigma_2$ denotes the conductivity of the contact layer contacting the surface electrode. Reference characters $d_1$ and $d_2$ denote the thickness of the surface electrode and the thickness of the contact layer, respectively. Reference character x denotes the distance from the bonding position of the wire on the surface electrode. Reference character $E_0$ denotes the junction voltage of the heterojunction diode at the active layer during the laser oscillation. Reference character W denotes the width of the active layer. Reference character $R_1$ denotes the resistance of the surface electrode for the length $\Delta x$ in the resonator length direction. Reference character $R_2$ denotes the resistance of the contact layer from the surface electrode to the active layer. Reference character I(x) denotes the current flowing in the surface electrode in the resonator length direction. Reference character j(x) denotes the current density in the contact layer. The current density in the contact layer is equivalent to the current density in the active layer. The current flowing into the contact layer is a variation of the current flowing through the surface electrode by the distance x from the wire bonding position, and it is represented by $j(x)\Delta xW$. The voltage of the surface electrode is represented as a function $V_f(x)$ of the distance x because the surface electrode has a relatively small conductivity $\sigma$.

From the equivalent circuit shown in FIG. 2, the following equations (2) and (3) are obtained.

$$V_f(x) = E0 - (I(x+\Delta x) - I(x))\frac{d2}{\sigma 2 W \Delta x} \quad (2)$$

$$V_f(x+\Delta x) - V_f(x) = -I(x)\frac{\Delta x}{\sigma 1 W d1} \quad (3)$$

In the formulae (2) and (3), when $\Delta x \rightarrow 0$ and I(x) is zero, the following formula (4) is obtained.

$$\left(\frac{d^2}{dx^2} - \frac{\sigma 2}{\sigma 1 d1 d2}\right)V_f(x) + \frac{\sigma 2 E0}{\sigma 1 d1 d2} = 0 \quad (4)$$

Assuming that the boundary conditions are $V_f(0) = V_f(0)$ and $V_f(\infty) = 0$, the formula (4) is reduced to $$V_f(x) = (V_f 0 - E0)e^{-\sqrt{\frac{\sigma 2}{\sigma 1 d1 d2}} \cdot x} + E0 \quad (5)$$

Although the current density j(x) of the active layer is represented by the following formula (6), since the following formula (7) is obtained from the formula (3), $$j(x) = \frac{dI(x)}{dx} \cdot \frac{1}{W} \quad (6)$$

$$I(x) = \sigma 1 W d1 \cdot \frac{dV_f(x)}{dx} \quad (7)$$

the current density j(x) of the active layer is represented by the following formula (8).

$$j(x) = \sigma 1 d1 \cdot \frac{d^2 V_f(x)}{dx^2} \quad (8)$$

$$= \frac{\sigma 2}{d2}(V_f 0 - E0)e^{-\sqrt{\frac{\sigma 2}{\sigma 1 d1 d2}} \cdot x}$$

From this formula (8), it is found that the current density j(x) of the active layer decreases exponentially with an increase in the distance x.

On the other hand, the light density distribution S(x) in the Fabry-Perot laser is generally represented by the following formula (9).

$$S(x) = \sqrt{Rf} \; e^{\frac{1}{2L}\ln\frac{1}{Rf Rr} \cdot x} + \frac{1}{\sqrt{Rf}} e^{-\frac{1}{2L}\ln\frac{1}{Rf Rr} \cdot x} C2 \quad (9)$$

wherein $R_f$ is the front facet reflectivity, $R_r$ is the rear facet reflectivity, L is the resonator length, C2 is a proportionality constant, and x is the distance from the front facet.

In the Fabry-Perot laser having the low reflectivity film at the front facet and the high reflectivity film at the rear facet, the first term on the right side of the formula (9) that represents the light density distribution is very small, negligible, as compared to the second term on the right side.

Accordingly, when $\sigma_1$, $\sigma_2$, $d_1$, $d_2$ are set so that the condition of the following formula (10) is satisfied and the wire is connected to a region of the surface electrode in the proximity of the front facet, from the formulae (8) and (9), the distribution of the current density j(x) in the active layer along the resonator length direction is approximately proportional to the distribution of the light density in the active layer along the resonator length direction, i.e., maximum at the front facet and gradually decreasing with distance from the front facet.

$$\sqrt{\frac{\sigma 2}{\sigma 1 d1 d2}} = \frac{1}{2L}\ln\frac{1}{Rf Rr} \quad (10)$$

Figure 4:
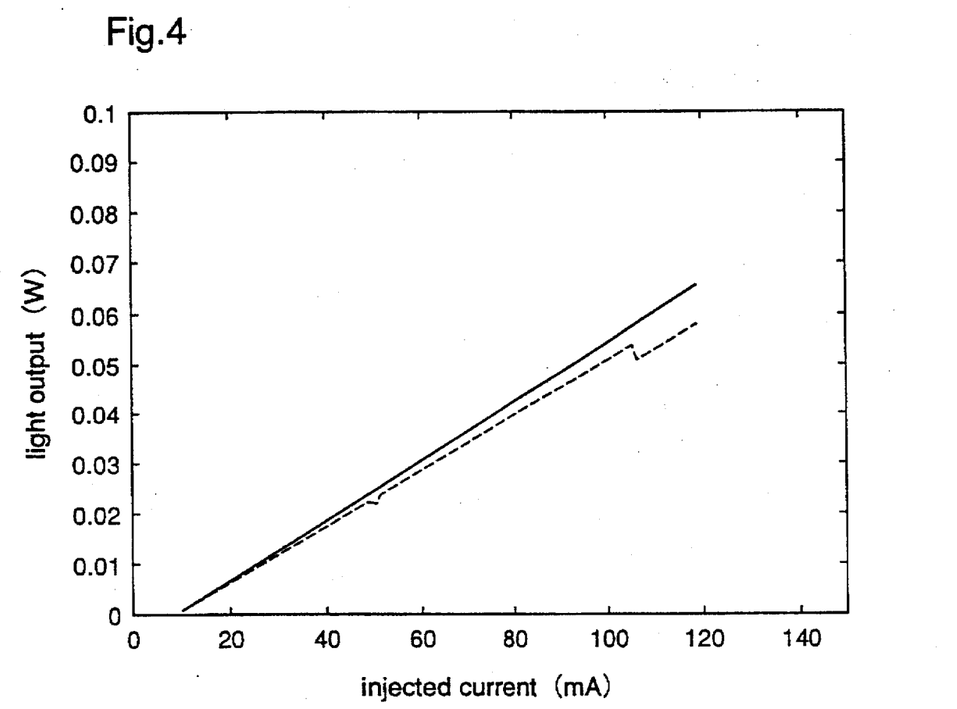
FIG. 4 is a diagram illustrating light output characteristics of the Fabry-Perot semiconductor laser device according to the first embodiment in comparison with light output characteristics of a prior art Fabry-Perot semiconductor laser device.

In the Fabry-Perot laser according to this first embodiment, as described above, the thickness of the evaporated Cr/Au film 2 is 0.5 μm and the thickness of the plated Au electrode 1 is 4 μm, i.e., the thickness of the surface electrode comprising the evaporated Cr/Au film 2 and the plated Au electrode 1 is 4.5 μm, the conductivity of the surface electrode is $4.5 \times 10^5$ $\Omega cm^{-1}$, the thickness of the p type InP contact layer 3 is 3 μm, and the conductivity of the contact layer 3 is 58 $\Omega cm^{-1}$. These values are within a range that satisfies the formula (10), and the Au wire 10 is bonded to the region of the plated Au electrode 1 in the vicinity of the front facet. Therefore, the distribution of the current density in the InGaAsP active layer 8 along the resonator length direction is approximately proportional to the distribution of the light density in the InGaAsP active layer 8 along the resonator length direction in which the light density is maximum at the front facet and gradually decreases with distance from the front facet. Accordingly, the carrier density in the InGaAsP active layer 8 along the resonator length direction becomes almost uniform, resulting in an oscillation of a high-power laser light. FIG. 4 shows light output characteristics of the Fabry-Perot laser according to this embodiment in comparison with light output characteristics of a prior art Fabry-Perot laser in which the thicknesses and the conductivities of the plated Au electrode 1 and the p type InP contact layer 3 are not set at values that satisfy the formula (10) and the Au wire is bonded to the center of the plated Au electrode 1. In the figure, the solid line represents the characteristics of the laser according to this embodiment and the dotted line represents the characteristics of the prior art laser. From this figure, it is found that the Fabry-Perot laser according to this embodiment oscillates at high efficiency and increased light output, as compared to the prior art Fabry-Perot laser.

When a Fabry-Perot semiconductor laser as described above is fabricated a junction-down process, the conductivity $\sigma_1$ of the electrode for current injection, i.e., surface electrode, comprising the evaporated Au-Ge/Ni/Ti/Pt/Au film and the plated Au electrode 11, the conductivity $\sigma_2$ of the n type InP substrate 6 contacting the surface electrode, the thickness $d_1$ of the surface electrode, and the thickness $d_2$ of the n type InP substrate 6 are set within a range that satisfies the formula (10), and the Au wire 10 is bonded to a portion of the plated Au electrode 11 in the vicinity of the front facet, whereby a Fabry-Perot semiconductor laser with the same effects as described above is realized.

Embodiment 2

While in the first embodiment of the invention a Fabry-Perot laser having a front facet with a low reflectivity and a rear facet of a high reflectivity is described, in this second embodiment a Fabry-Perot laser having a front facet and a rear facet of the same reflectivity will be described.

Figure 5:
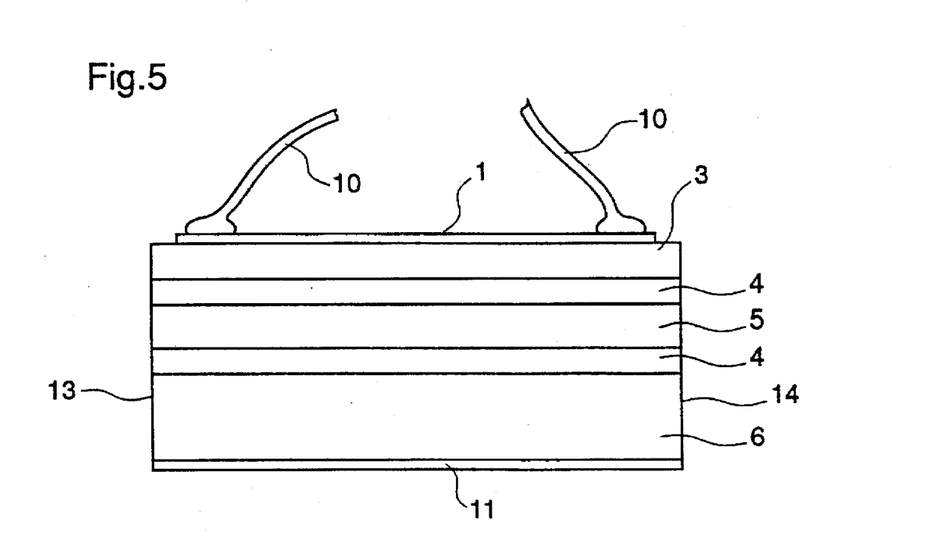
FIG. 5 is a side view of a Fabry-Perot semiconductor laser in the resonator length direction according to a second embodiment of the present invention.

FIG. 5 is a side view in the resonator length direction illustrating a Fabry-Perot laser according to the second embodiment of the invention. In the figure, the same reference numerals as in FIG. 1 designate the same or corresponding elements. The fundamental laser structure of this Fabry-Perot laser is identical to the structure of the Fabry-Perot laser according to the first embodiment. A front facet 13 and a rear facet 14 which are formed by cleaving the respective semiconductor layers are used as resonator facets, and two Au wires 10 are bonded to regions of the plated Au electrode 1 in the proximity of the front facet and the rear facet, respectively. The reflectivities of the front facet 13 and the rear facet 14 are 30%.

Figure 6:
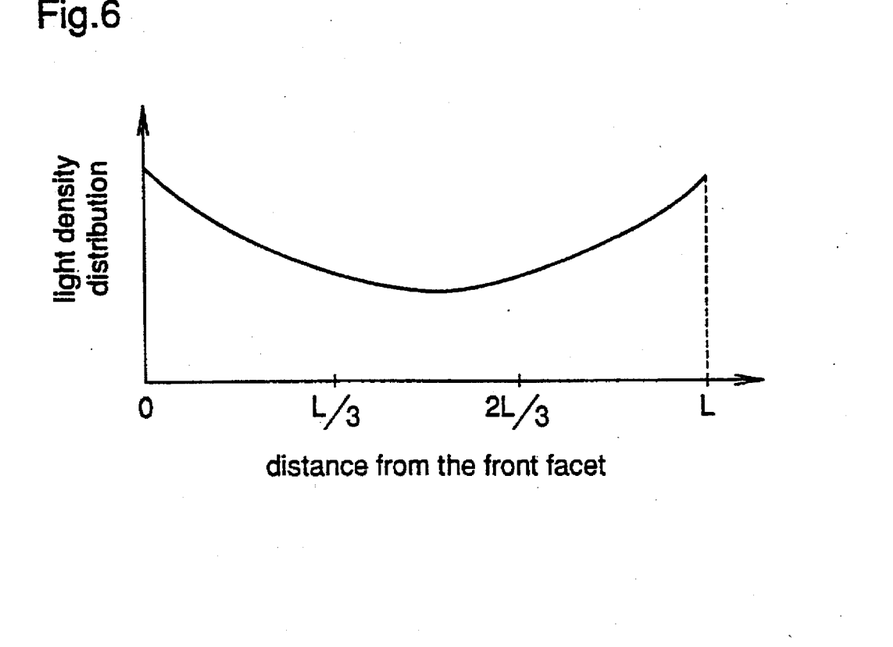
FIG. 6 is a diagram showing a distribution of light density in the active layer along the resonator length direction of the Fabry-Perot semiconductor laser device having resonator front and rear facets of the same reflectivity.

FIG. 6 is a diagram illustrating a distribution of light density in the active layer and along the resonator length direction of the Fabry-Perot semiconductor laser having the resonator front and rear facets with the same reflectivity. In FIG. 6, reference character L denotes the distance from the front facet to the rear facet. As shown in FIG. 6, the Fabry-Perot semiconductor laser with front and rear facets of the same reflectivity has a light density distribution in which the light density is maximum in regions in the proximity of the front and rear facets and gradually decreases getting nearer to the center region.

In the Fabry-Perot semiconductor laser according to this second embodiment shown in FIG. 5, as in the Fabry-Perot semiconductor laser according to the first embodiment, the thickness of the surface electrode is 4.5 µm, the conductivity of the surface electrode 1 is $4.5 \times 10^5$ $\Omega\text{cm}^{-1}$, the thickness of the p type InP contact layer 3 is 3 µm, and the conductivity of the contact layer is 58 $\Omega\text{cm}^{-1}$, and these values satisfy the formula (10). Therefore, when current is injected from the Au wires 10 which are respectively bonded to regions of the plated Au electrode in the proximity of the front facet 13 and the rear facet 14, the current density distribution in the InGaAsP active layer 8 along the resonator length direction is approximately proportional to the light density distribution, i.e., it becomes a distribution in which the current density is maximum in the regions in the proximity of the front facet and the rear facet and decreases getting nearer to the center region. Accordingly, the carrier density in the InGaAsP active layer 8 along the resonator length direction becomes almost uniform. As a result, the Fabry-Perot laser according to this second embodiment oscillates with high efficiency and increased light output, as compared to the prior art Fabry-Perot laser.

When a Fabry-Perot semiconductor laser as described above is fabricated in a junction-down process, the conductivity $\sigma_1$ of the electrode for current injection, i.e., surface electrode, comprising the evaporated Au-Ge/Ni/Ti/Pt/Au film and the plated Au electrode 11, the conductivity $\sigma_2$ of the n type InP substrate 6 contacting the surface electrode, the thickness $d_1$ of the surface electrode, and the thickness $d_2$ of the n type InP substrate 6 are set within a range that satisfies the formula (10), and the Au wires 10 are bonded to portions of the plated Au electrode 11 in the vicinity of the front and rear facets, respectively, whereby a Fabry-Perot semiconductor laser with the same effects as described above is realized.

Embodiment 3

Figure 7:
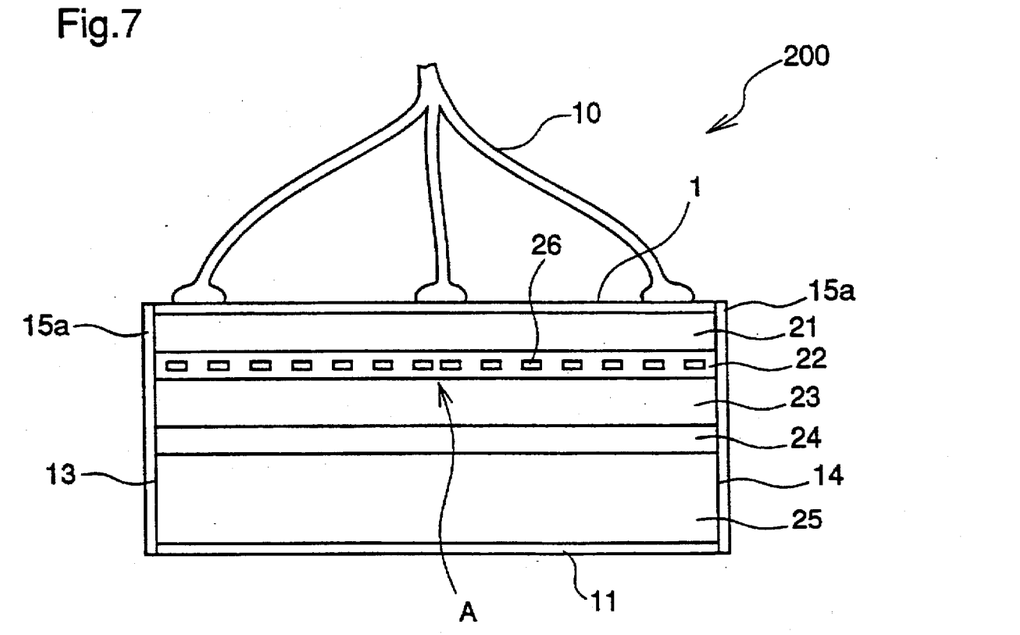
FIG. 7 is a cross-sectional view of a λ/4 shifted DFB laser, taken along the resonator length direction, according to a third embodiment of the present invention.

FIG. 7 is a cross-sectional view of a λ/4-shifted DFB (distributed feedback) laser, taken along the resonator length direction, according to a third embodiment of the present invention. In the figure, the same reference numerals as in FIG. 1 designate the same or corresponding elements. Reference numeral 200 designates a λ/4-shifted DFB laser. The λ/4-shifted DFB laser 200 includes an n type InP substrate 25 100 µm thick. An n type InGaAsP lower cladding layer 24 1.3 µm thick is disposed on the front surface of the n type InP substrate 25. An InGaAsP active layer 23 0.2 µm thick is disposed on the n type InGaAsP lower cladding layer 24. An n type InGaAsP upper cladding layer 24 1.3 µm thick is disposed on the InGaAsP active layer 23. A p type InP contact layer 21 3 µm thick is disposed on the p type InGaAsP upper cladding layer 22. A diffraction grating 26 having a λ/4 phase-shifted region is disposed within the p type InGaAsP upper cladding layer 22. An evaporated Cr/Au film 0.5 µm thick (not shown) is disposed on the p type InP contact layer 21, and a plated Au electrode 1 is disposed on the upper surface of evaporated Cr/Au film. An evaporated Au-Ge/Ni/Ti/Pt/Au film (not shown) is disposed on the rear surface of the n type InP substrate 25, and a plated Au electrode 11 is disposed on the evaporated Au-Ge/Ni/Ti/Pt/ Au film. A front facet 13 and a rear facet 14 which are formed by cleaving the respective semiconductor layers 21–25 are coated with facet protective films 15a having a reflectivity of 0%. Reference character A denotes a λ/4-shifted point of the diffraction grating. Three Au wires 10 are bonded to the plated Au electrode 1 in the proximity of the front facet 13, in the proximity of the rear facet 14, and in the center of the electrode 1 along the resonator length direction, i.e., opposite the λ/4-shifted point A of the diffraction grating 26, respectively. The conductivity of the p side electrode comprising the evaporated Cr/Au film located on the p type InP contact layer 21 and the plated Au electrode 1 to which the Au wires 10 are bonded is $4.5 \times 10^5$ $\Omega\text{cm}^{-1}$ the carrier concentration of the p type InP contact layer 21 is $1 \times 10^{18}$ $\text{cm}^{-3}$, and the conductivity of the contact layer 21 is 58 $\Omega\text{cm}^{-1}$.

Figure 8:
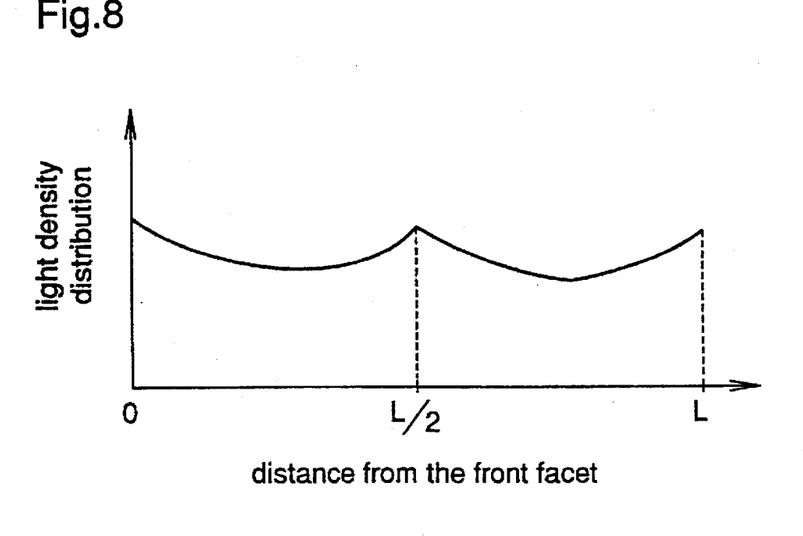
FIG. 8 is a diagram showing a distribution of light density in the active layer along the resonator length direction of the λ/4 shifted DFB laser including a diffraction grating with a λ/4 phase-shifted point.

FIG. 8 is a diagram illustrating a distribution of light density in the active layer along the resonator length direction of the λ/4-shifted DFB laser having the diffraction grating with the λ/4-shifted point according to this third embodiment of the present invention. As shown in this figure, in the distribution of light density in the active layer along the resonator length direction of the λ/4-shifted DFB laser, the light density is high in regions in the vicinity of the front and rear facets, once decreases in regions between the front and rear facets and the center region in the resonator length direction, and has a localized maximum point in the center region in the resonator length direction.

Also in the λ/4-shifted DFB laser according to this third embodiment of the invention, as in the first embodiment, the thicknesses and the conductivities of the plated Au electrode 1 and the p type InP contact layer 21 are set so that the current density in the active layer 23 decreases exponentially with distance from the bonding positions of the wires 10 on the plated Au electrode 1, and the three Au wires 10 are bonded to the plated Au electrode 1 at a portion in the proximity of the front facet 13, a portion in the proximity of the rear facet 14, and a portion in the center of the electrode 1 along the resonator length direction, i.e., a portion opposite the λ/4-shifted point A of the diffraction grating 26, respectively. Therefore, the current density distribution in the active layer 23 along the resonator length direction is proportional to the light density distribution in the active layer 23 along the resonator length direction shown in FIG. 7. As a result, as compared to the prior art λ/4-shifted DFB laser in which a wire is bonded to a center portion of the electrode, the threshold gain difference during operation is increased, whereby single-mode oscillation at the laser oscillation is further promoted.

When a λ/4-shifted DFB laser as described above is fabricated in a junction-down process, the conductivity σ₁ of the electrode for current injection, i.e., surface electrode, comprising the evaporated Au-Ge/Ni/Ti/Pt/Au film and the plated Au electrode 11, the conductivity σ₂ of the n type InP substrate 6 contacting the surface electrode, the thickness d₁ of the surface electrode, and the thickness d₂ of the n type InP substrate 6 are set within a range that satisfies the formula (10). The Au wires 10 are bonded to portions of the plated Au electrode 11 in the vicinity of the front and rear facets, respectively, and to a portion in the center of the electrode 11 in the resonator length direction, whereby a λ/4-shifted DFB laser with the same effects as described above is realized.

Embodiment 4

Figure 9:
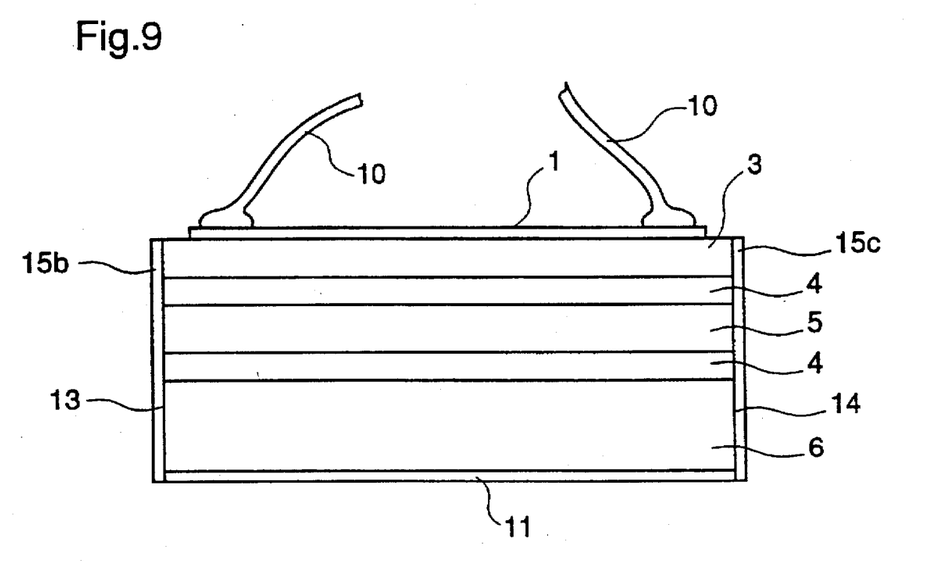
FIG. 9 is a cross-sectional view of a semiconductor light amplifier, taken along the resonator length direction, according to a fourth embodiment of the present invention.

FIG. 9 is a side view of a semiconductor light amplifier along the resonator length direction, according to a fourth embodiment of the present invention. In the figure, the same reference numerals as those shown in FIG. 1 designate the same or corresponding elements. Reference numeral 15b designates a reflecting film comprising alumina and having a reflectivity of 1%, and reference numeral 15c designates a reflecting film comprising alumina and having a reflectivity of 5%. The fundamental device structure of the semiconductor light amplifier according to this fourth embodiment is identical to the structure of the Fabry-Perot laser according to the first embodiment except that the front and rear facets are coated with the low reflectivity films 15b and 15c and two Au wires are bonded to regions of the plated Au electrode 1 in the proximity of the front facet 13 and the rear facet 14, respectively.

In operation, the semiconductor light amplifier amplifies light that is incident on the reflecting film 15c having a reflectivity higher than the reflectivity of the reflecting film 15b, and outputs the light through the reflecting film 15b.

In the semiconductor light amplifier according to the fourth embodiment of the invention, as in the first and second embodiments, the thicknesses and the conductivities of the plated Au film 1 and the p type InP contact layer 3 are set so that the current density in the InGaAsP active layer 8 decreases exponentially with the distance from the Au wire bonding positions on the plated Au electrode 1. Therefore, like the Fabry-Perot laser according to the second embodiment, the current density distribution in the InGaAsP active layer 8 along the resonator length direction during operation is proportional to the light density distribution in which the light density is maximum in regions in the proximity of the front and rear facets and gradually decreases nearer to the center region, whereby the carrier density in the InGaAsP active layer 8 along the resonator length direction becomes almost uniform.

Figure 10:
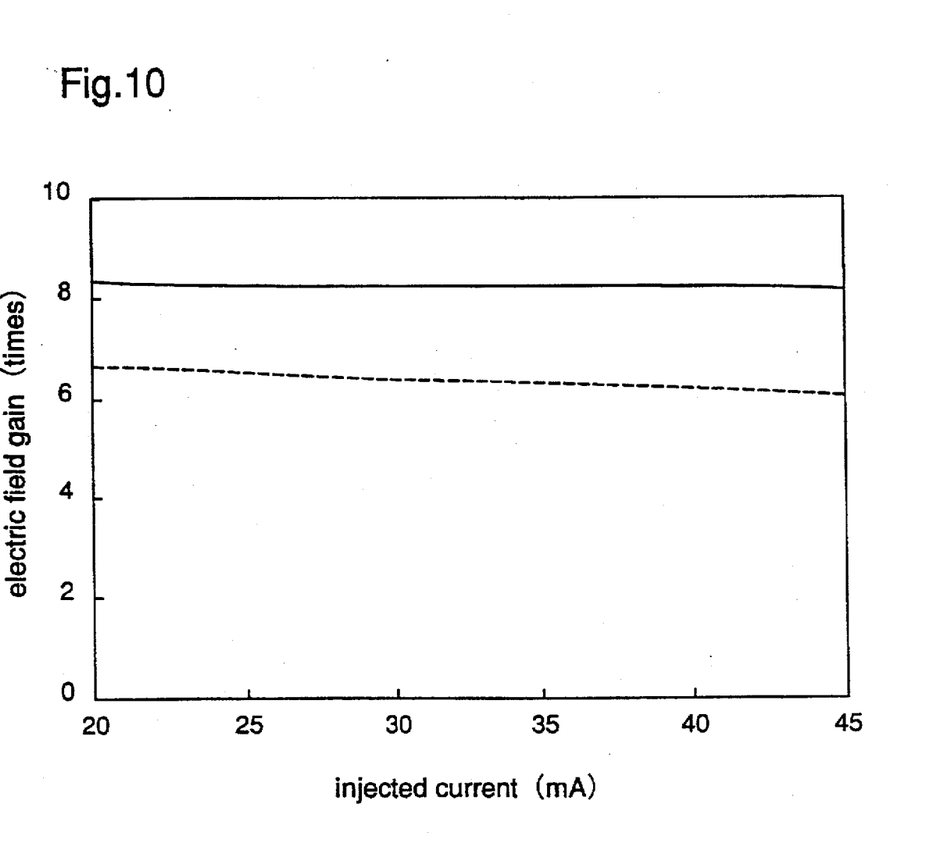
FIG. 10 is a diagram illustrating the gain vs. current characteristics of the semiconductor light amplifier according to the fourth embodiment in comparison with the gain vs. current characteristics of the prior art semiconductor light amplifier.

FIG. 10 shows gain vs. current characteristics of a semiconductor light amplifier according to this embodiment in comparison with gain vs. current characteristics of a prior art semiconductor light amplifier in which the thicknesses and the conductivities of the plated Au electrode 1 and the p type InP contact layer 3 are not set at values that satisfy the formula (10) and the Au wire is bonded to a portion in the center of the plated Au electrode 1. In the figure, the solid line represents the characteristics of the amplifier according to this embodiment and the dotted line represents the characteristics of the prior art amplifier. From this figure, it is found that the semiconductor light amplifier according to this fourth embodiment provides a greater gain than the prior art semiconductor light amplifier.

When a semiconductor light amplifier as described above is fabricated in a junction-down process, the conductivity σ₁ of the electrode for current injection, i.e., surface electrode, comprising the evaporated Au-Ge/Ni/Ti/Pt/Au film and the plated Au electrode 11, the conductivity σ₂ of the n type InP substrate 6 contacting the surface electrode, the thickness d₁ of the surface electrode, and the thickness d₂ of the n type InP substrate 6 are set within a range that satisfies the formula (10), and the Au wires 10 are bonded to portions of the plated Au electrode 11 in the vicinity of the front and rear facets, respectively, whereby a semiconductor light amplifier with the same effects as described above is realized.

What is claimed is:

1. A semiconductor laser device comprising:

an active layer through which light travels in a resonator length direction between front and rear facets that are transverse to the resonator length direction, the active layer having opposed first and second surfaces, and the front and rear facets having substantially the same reflectivities;

a semiconductor layer of a first conductivity type disposed on the first surface of the active layer;

a first electrode in electrical communication with the first conductivity type semiconductor layer, disposed opposite the first surface of the active layer, and extending between the front and rear facets;

a semiconductor layer of a second conductivity type, opposite the first conductivity type, disposed on the second surface of the active layer;

a second electrode in electrical communication with the second conductivity type semiconductor layer, disposed opposite the second surface of the active layer, and extending between the front and rear facets; and a first wire and a second wire bonded to the first electrode at respective positions proximate the front facet and the rear facet, the positions corresponding to localized maxima of light density distribution in the active layer along the resonator length direction.

2. The semiconductor laser device of claim 1 wherein the front facet and the rear facet have reflectivities of 30%.

3. The semiconductor laser device of claim 1 including a semiconductor contact layer of the first conductivity type, interposed between and contacting the semiconductor layer of a first conductivity type and the first electrode, and having a thickness, the first electrode having a thickness, an optical resonator between the front and rear facets along the resonator length direction having a length, and $$(\sigma_2/\sigma_1\, d_1\, d_2)^{1/2} = (1/2L)\ln(1/R_f R_r)$$

where $\sigma_1$ is the electrical conductivity of the first electrode,
$\sigma_2$ is the electrical conductivity of the contact layer,
$d_1$ is the thickness of the first electrode,
$d_2$ is the thickness of the contact layer,
L is the resonator length between the front and rear facets along the resonator length direction,
$R_f$ is the reflectivity of the front facet, and
$R_r$ is the reflectivity of the rear facet.

4. A semiconductor laser device comprising:

an active layer through which light travels in a resonator length direction between front and rear facets that are transverse to the resonator length direction, the active layer having opposed first and second surfaces, the front facet having a first reflectivity, and the rear facet having a second reflectivity wherein the second reflectivity is substantially larger than the first reflectivity;

a semiconductor layer of a first conductivity type disposed on the first surface of the active layer;

a first electrode in electrical communication with the first conductivity type semiconductor layer, disposed opposite the first surface of the active layer, and extending between the front and rear facets;

a semiconductor layer of a second conductivity type, opposite the first conductivity type, disposed on the second surface of the active layer;

a second electrode in electrical communication with the second conductivity type semiconductor layer, disposed opposite the second surface of the active layer, and extending between the front and rear facets; and a first wire bonded to the first electrode proximate the front facet at a position corresponding to a localized maximum of light distribution in the active layer along the resonator length direction.

5. The semiconductor laser device of claim 4 wherein the first reflectivity is 5% and the second reflectivity is 95%.

6. The semiconductor laser device of claim 4 including a second wire bonded to the first electrode proximate the front facet wherein the first wire and the second wire lie along a direction transverse to the resonator length direction.

7. The semiconductor laser device of claim 4 including a semiconductor contact layer of the first conductivity type, interposed between and contacting the semiconductor layer of a first conductivity type and the first electrode, and having a thickness, the first electrode having a thickness, an optical resonator between the front and rear facets along the resonator length direction having a length, and $$(\sigma_2/\sigma_1\, d_1\, d_2)^{1/2} = (1/2L)\ln(1/R_f R_r)$$

where $\sigma_1$ is the electrical conductivity of the first electrode,
$\sigma_2$ is the electrical conductivity of the contact layer,
$d_1$ is the thickness of the first electrode,
$d_2$ is the thickness of the contact layer,
L is the resonator length between the front and rear facets along the resonator length direction,
$R_f$ is the reflectivity of the front facet, and
$R_r$ is the reflectivity of the rear facet.

8. A semiconductor laser device comprising:

an active layer through which light travels in a resonator length direction between front and rear facets that are transverse to the resonator length direction, the active layer having opposed first and second surfaces, and the front and rear facets having substantially the same reflectivities;

a semiconductor layer of a first conductivity type disposed on the first surface of the active layer;

a first electrode in electrical communication with the first conductivity type semiconductor layer, disposed opposite the first surface of the active layer, and extending between the front and rear facets;

a semiconductor layer of a second conductivity type, opposite the first conductivity type, disposed on the second surface of the active layer;

a second electrode in electrical communication with the second conductivity type semiconductor layer, disposed opposite the second surface of the active layer, and extending between the front and rear facets;

a diffraction grating including a $\lambda/4$ phase shift region, the diffraction grating being disposed at one of the first and second surfaces or within one of the semiconductor layer of the first conductivity type and the semiconductor layer of the second conductivity type; and first, second, and third wires bonded to the first electrode at respective positions proximate the front facet, opposite the $\lambda/4$ phase shift region, and proximate the rear facet, the positions corresponding to localized maxima of light density distribution in the active layer along the resonator length direction, the first, second, and third wires being electrically connected together.

9. A semiconductor light amplifier device comprising:

an active layer through which light travels in a resonator length direction between front and rear facets that are transverse to the resonator length direction, the active layer having opposed first and second surfaces, the front facet having a first reflectivity, and the rear facet having a second reflectivity wherein the second reflectivity is larger than the first reflectivity;

a semiconductor layer of a first conductivity type disposed on the first surface of the active layer;

a first electrode in electrical communication with the first conductivity type semiconductor layer, disposed opposite the first surface of the active layer, and extending between the front and rear facets;

a semiconductor layer of a second conductivity type, opposite the first conductivity type, disposed on the second surface of the active layer;

a second electrode in electrical communication with the second conductivity type semiconductor layer, disposed opposite the second surface of the active layer, and extending between the front and rear facets; and a first wire and a second wire bonded to the first electrode at respective positions proximate the front facet and the rear facet, the positions corresponding to localized maxima of light density distribution in the active layer along the resonator length direction.

10. The semiconductor light amplifier of claim 9 wherein the first reflectivity is 1% and the second reflectivity is 5%.

* * * * *